(12) United States Patent
Oblak et al.

(10) Patent No.: US 11,906,604 B2
(45) Date of Patent: Feb. 20, 2024

(54) METHOD FOR EXTRACTING A TRANSVERSE MAGNETO-OPTIC EFFECT SIGNAL

(71) Applicant: ASOCIACIÓN CENTRO DE INVESTIGACIÓN COOPERATIVA EN NANOCIENCIAS "CIC NANOGUNE", Donostia (ES)

(72) Inventors: Eva Oblak, Donostia (ES); Patricia Riego Saavedra, Donostia (ES); Andreas Berger, Donostia (ES); Aitor García Manso, Donostia (ES); Ane Martínez De Guereñu Elorza, Donostia (ES); Fernando Arizti, Donostia (ES); Andoni Irizar Picón, Donostia (ES)

(73) Assignee: ASOCIACIÓN CENTRO DE INVESTIGACIÓN COOPERATIVA EN NANOCIENCIAS "CIC NANOGUNE", Donostia (ES)

( * ) Notice: Subject to any disclaimer, the term of this patent is extended or adjusted under 35 U.S.C. 154(b) by 270 days.

(21) Appl. No.: 17/514,351

(22) Filed: Oct. 29, 2021

(65) Prior Publication Data

US 2022/0050147 A1 Feb. 17, 2022

Related U.S. Application Data

(63) Continuation of application No. PCT/EP2020/061966, filed on Apr. 29, 2020.

(30) Foreign Application Priority Data

Apr. 30, 2019 (EP) ..................................... 19382328

(51) Int. Cl.
*G01R 33/032* (2006.01)
*G01N 21/21* (2006.01)

(52) U.S. Cl.
CPC ....... *G01R 33/0325* (2013.01); *G01N 21/211* (2013.01)

(58) Field of Classification Search
CPC .... G01R 33/0325; G01R 33/02; G01R 33/12; G01N 21/211
See application file for complete search history.

(56) References Cited

U.S. PATENT DOCUMENTS 5,631,559 A * 5/1997 Oliver ................ G01R 33/0325
324/244.1
6,528,993 B1 * 3/2003 Shin .................... G01R 33/032
359/489.08

(Continued)

OTHER PUBLICATIONS

International Search Report and Written Opinion in PCT/EP2020/061966, dated Jun. 4, 2020, 14 pages.

(Continued)

*Primary Examiner* — Akm Zakaria
(74) *Attorney, Agent, or Firm* — Edell, Shapiro & Finnan, LLC

(57) ABSTRACT

An apparatus to detect and measure a T-MOKE signal includes a first linear polarizer located on the optical path between a light source and a reflecting surface of a sample, a device to produce a magnetic field at the sample location, the device being configured to direct the magnetization perpendicularly to the optical plane of incidence and to reverse the direction of the magnetic field, a rotatable quarter-wave plate located after the reflecting surface on the optical path of the reflected light, a second linear polarizer that is rotatable and is located after the quarter-wave plate on the optical path of the reflected light, and a photo-detector located after the second linear polarizer on the optical path of the reflected light, the photo-detector being configured to measure the intensity of the light. A method for extracting a T-MOKE signal in an ellipsometric measurement procedure (Continued)

employs such an apparatus. The method includes a polarization detection scheme to ascertain that a T-MOKE signal (and not a noise signal) is indeed detected.

20 Claims, 2 Drawing Sheets

(56) References Cited

U.S. PATENT DOCUMENTS

| | | | |
|---|---|---|---|
| 6,956,660 B2 * | 10/2005 | Meeks | G01B 11/303 356/630 |
| 2005/0024049 A1 | 2/2005 | Schutzmann et al. | |
| 2007/0165228 A1 * | 7/2007 | Strocchia-Rivera | G01N 21/211 356/369 |

OTHER PUBLICATIONS

Samuel R Bowden et Al.: "Optical Characterization of All-Magnetic NOT Gate Operation in Vortex Rings", IEEE Transactions on Magnetics, IEEE Service Center, New York, NY, US, vol. 45, No. 12, 1, (Dec. 1, 2009), 7 pages.

E. Oblak et Al.: "Ultrasensitive T-MOKE measurements by means of effective polarization change detection", Journal of Physics D: Appl. Phys. 50 (2017), 6 pages.

* cited by examiner

FIG. 1
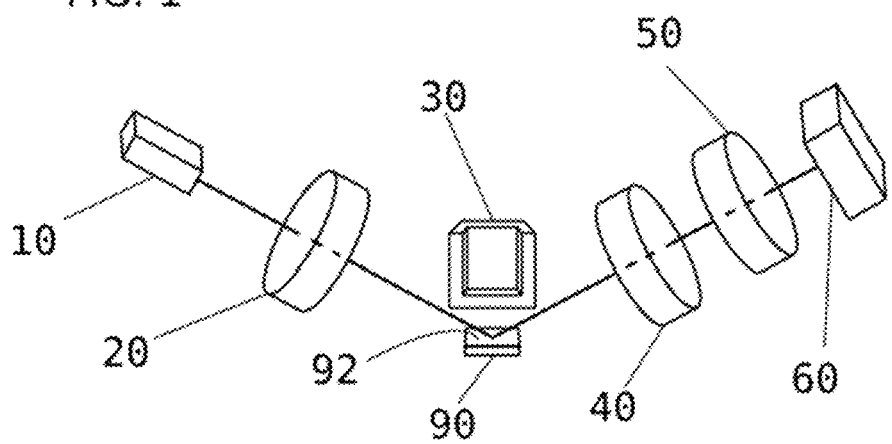
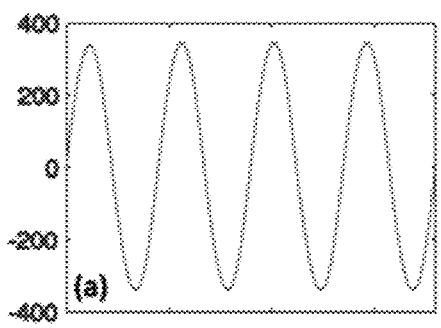
FIG. 2A
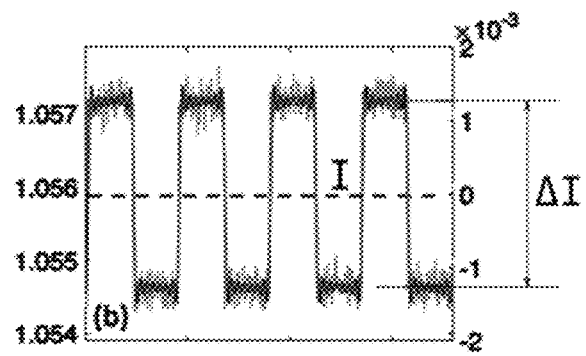
FIG. 2B
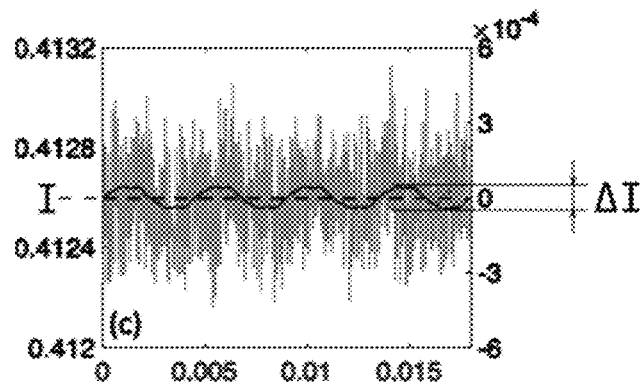
FIG. 2C

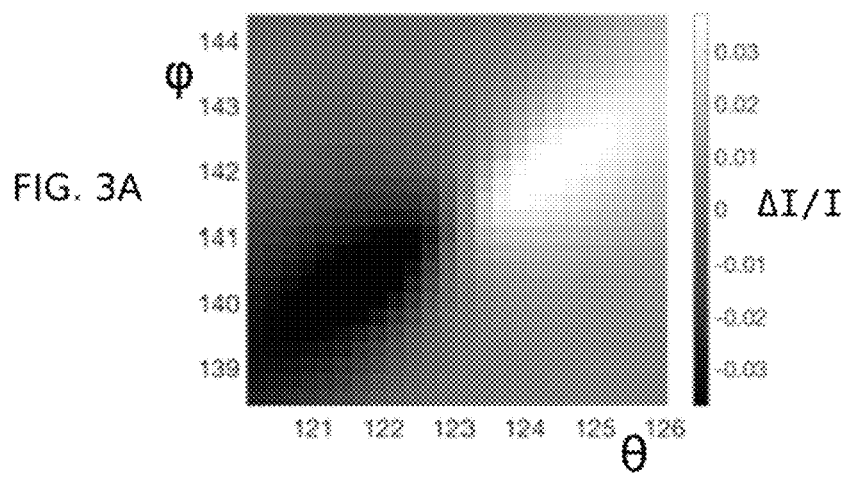
FIG. 3A
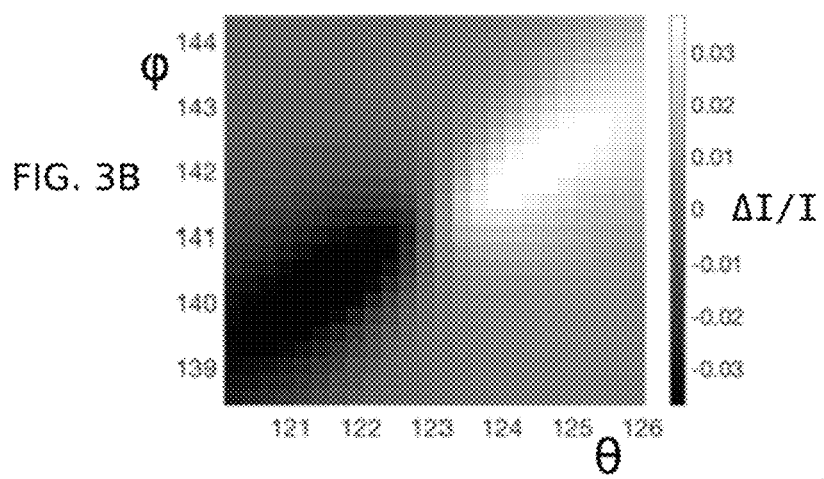
FIG. 3B
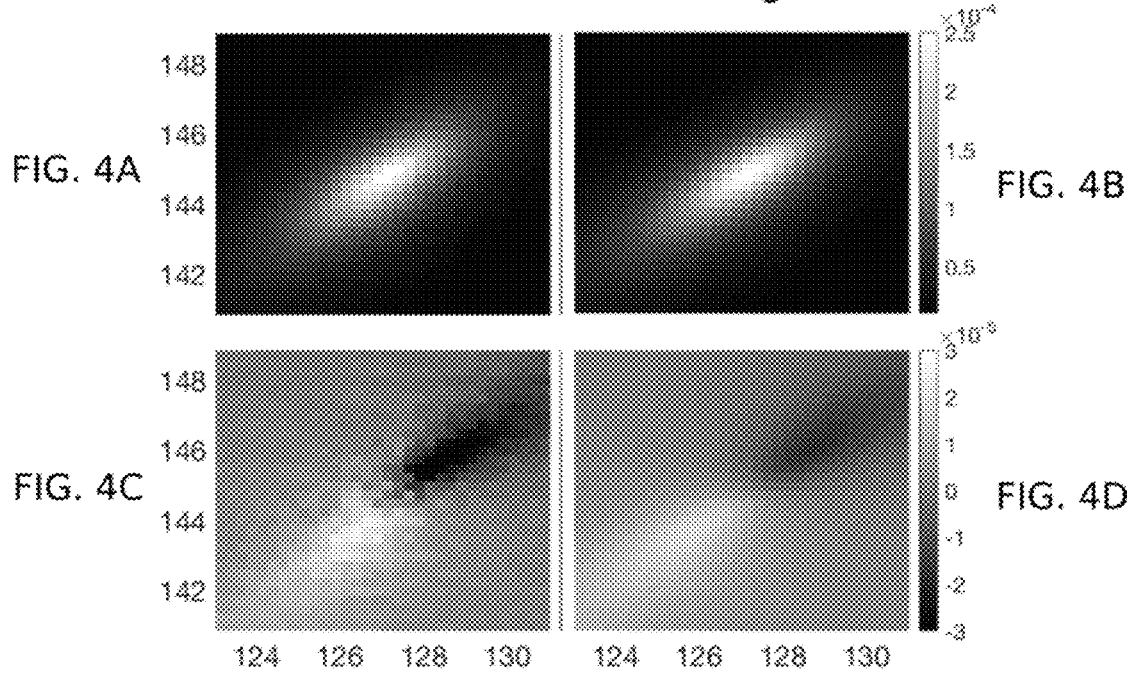
FIG. 4A
FIG. 4B
FIG. 4C
FIG. 4D

METHOD FOR EXTRACTING A TRANSVERSE MAGNETO-OPTIC EFFECT SIGNAL

CROSS-REFERENCE TO RELATED APPLICATIONS

This application relates to and claims the benefit and priority to International Application No. PCT/EP2020/061966, filed Apr. 29, 2020 which claims the benefit and priority to European Patent Application No. EP19382328.3 filed on Apr. 30, 2019.

FIELD

The present disclosure relates to a method and apparatus for extracting a transverse magneto-optic Kerr effect signal in an ellipsometric measurement procedure upon a sample having an at least partially reflecting surface.

BACKGROUND

The magneto-optical Kerr effect (MOKE) is a well-established method for the study of the magnetization properties of thin films and surfaces. It is based upon small, magnetization-induced changes in the optical properties of the material under investigation, which in turn modify the polarization and/or intensity of reflected light.

MOKE is classified according to the magnetization orientation in reference to the flat surface of a sample and the plane of incidence of a light beam that falls upon the surface (the optical plane of incidence is the plane that contains the surface normal and the propagation vector of the incoming radiation, or, equivalently, the plane that contains both the incoming and the reflected light ray). When the magnetization is perpendicular to the sample surface, the effect is known as polar MOKE. When the magnetization is parallel to the sample surface, the effect is called longitudinal MOKE or transverse MOKE, with the former referring to the magnetization lying in the plane of incidence and the latter perpendicular to it. Depending on the specific magnetization orientation, the magnetic material affects different aspects of the reflected light. In the case of polar and longitudinal MOKE, the sample magnetization leads to a rotation and ellipticity change of the reflected light polarization that inverts if the magnetization itself is inverted (magnetization reversal). In transverse geometry, one observes a tiny change in the intensity of the reflected light for incident p-polarized radiation upon magnetization reversal.

Ellipsometry is an optical technique that measures the change of polarization upon reflection or transmission of light.

Studies using the polar or longitudinal MOKE are far more common and overall preferred by the research community due to the fact that polarization measurements allow for more sensitive detection, even if transverse MOKE (T-MOKE) experiments are simpler given that they are easily-operated light intensity measurements.

For many applications, it is important to enhance the magneto-optical response and, for this reason, numerous studies have been conducted in order to find ways to enhance the magneto-optical effects. This is especially significant for T-MOKE applications because of its simple operation, although T-MOKE measurements tend to produce rather weak signal amplitudes compared to the longitudinal (L-MOKE) and especially the polar P-MOKE.

The scientific paper "*Ultrasensitive T-MOKE measurements by means of effective polarization change detection*", by E. Oblak et al. (Journal of Physics D: Appl. Phys. 50 (2017), 23LT01), reports two experimental methods. The first method is a direct intensity T-MOKE measurement scheme in which only p-polarized incoming light is used and light intensity changes are monitored as the magnetic field is altered and causes a reversal of the sample magnetization. The second method is a polarization detection scheme, for mixed s-polarized and p-polarized incoming light, that measures the magnetization state induced effective change in polarization as a function of the applied field.

This paper further reports a big enhancement of the relative change in light intensity ($\Delta I/I$) as measured with the second method by means of a suitable optical set-up, due to the fact that a large proportion of the reflected light that does not carry T-MOKE information is separated by the utilized polarization optics and is not detected.

However, the paper also discloses that the performance of some elements of the experimental setup was not optimized due to other contradictory requirements, and it points out that further optimization can improve the detection threshold of T-MOKE signals. Furthermore, given that the sensitive detection of the T-MOKE effect described in the paper is based on one individual relative intensity measurement ($\Delta I/I$), the method is susceptible to false positive signal identification if other aspects of the experimental set-up lead to a signal modification that is synchronous with the magnetic field variation.

SUMMARY

In a first aspect, a method for extracting a T-MOKE signal is provided (in this context, to extract means to detect and measure). The method includes an ellipsometric measurement procedure upon a sample and employs an apparatus comprising a light source intended to emit a light beam that is to follow an optical path, the sample having a reflecting surface arranged to reflect, at least partially, the light beam in an optical plane of incidence. The apparatus further comprises:

a first linear polarizer located on the optical path between the light source and the reflecting surface;

a device to produce a magnetic field at the sample location, the device being configured to direct the magnetization perpendicularly to the optical plane of incidence and to reverse the direction of the magnetic field;

a rotatable quarter-wave plate located after the reflecting surface on the optical path of the reflected light beam;

a second linear polarizer that is rotatable and is located after the quarter-wave plate on the optical path of the reflected light beam;

a photo-detector located after the second linear polarizer on the optical path of the reflected light beam, the photo-detector being configured to measure the intensity of the light that reaches it.

The sample can be represented by a Jones reflection matrix like $$\begin{bmatrix} r_s & 0 \\ 0 & r_p + \beta \end{bmatrix},$$

where $r_s$ is the complex Fresnel reflection coefficient for s-polarization, $r_p$ is the complex Fresnel reflection coefficient for p-polarization and $\beta$ is a complex coefficient that represents the component of light reflected on the reflecting surface due to the magnetic-field induced magnetization of the sample, whereby $\tilde{\beta}=\beta/r_p$ is a relative T-MOKE coefficient.

The method comprises the steps of:

a) defining a grid of at least six angle pairs, each angle pair being formed by an orientation angle $\varphi$ for the quarter-wave plate and a polarization angle $\theta$ for the second linear polarizer, the orientation angle $\varphi$ being the angular distance between the quarter-wave plate axis and the optical plane of incidence, and the polarization angle $\theta$ being the angular distance between the second linear polarizer axis and the optical plane of incidence;

b) setting the first linear polarizer at a fixed polarization angle $\alpha$ that is neither 0° nor 90°, the fixed polarization angle $\alpha$ being the angular distance between the first linear polarizer axis and the optical plane of incidence;

c) setting the quarter-wave plate at the orientation angle $\varphi$ of an angle pair;

d) setting the second linear polarizer at the polarization angle $\theta$ of the same angle pair of step (c);

e) testing the set angle pair by making the light source to emit a light beam along the optical path, whereby the light beam is transmitted through the first linear polarizer, is reflected, at least partially, by the reflecting surface of the sample, is transmitted through the quarter-wave plate, is transmitted through the second linear polarizer and reaches the photo-detector;

f) recording a measurement of the light intensity from the photodetector;

g) recording a measurement of the light intensity from the photodetector upon a magnetic-field reversal with respect to the measurement of step (f);

h) computing and recording a relative change in the light intensity ($\Delta I/I$) due to magnetization reversal upon the magnetic-field reversal of step (g);

i) setting the quarter-wave plate at the orientation angle of another angle pair;

j) setting the second linear polarizer at the polarization angle of the same angle pair of step (i);

k) repeating steps (e) to (j) until at least six of the angle pairs of the grid have been tested;

l) determining numerical values of real free fit parameters $B_1$, $B_2$, $B_3$, $B_4$, $B_5$ and $B_6$ by matching the collection of the recorded relative changes in the light intensity to equation $\Delta I/I = f(\alpha, \varphi, \theta, B_1, B_2, B_3, B_4, B_5, B_6)$, where f is a function mathematically derived for the relative change in the light intensity.

The method thus proposes a polarization detection scheme to ascertain that a T-MOKE signal (and not a noise signal) is indeed detected and to measure it. This improvement is based on the realization that the sensitivity of the measurement scheme towards the T-MOKE signals depends on the precise orientation of the quarter-wave plate (angle $\varphi$) and of the second linear polarizer (angle $\theta$) in a precise manner, so that, upon varying $\varphi$ and $\theta$ in a well-defined way, a T-MOKE signal (and not any other signal but only a T-MOKE signal) will follow a precise pattern that can be predicted because the inventors have developed a mathematical solution of the shape of the real T-MOKE signals (function f). The detection configuration ($\varphi$, $\theta$) is thus changed during a measurement sequence, making it possible to unambiguously isolate actual T-MOKE signals from noise signals.

In some examples, the relative T-MOKE coefficient $\tilde{\beta}$ may be computed as a derived function of B1 and B2, for example $\tilde{\beta}=B_1+iB_2$.

In some examples, the other parameters (different from $B_1$ or $B_2$) may be related to the Fresnel reflection coefficients, or may represent optical or electronic imperfections in the apparatus or background noise.

In some examples, the function f may be:

$$4\frac{B_1\sin^2\alpha h_2 + \cos\alpha\sin\alpha\left[\begin{array}{c}(B_1B_3+B_2B_4)h_3 - \\ (B_1B_4-B_2B_3)h_4\end{array}\right] + \frac{1}{2}B_6}{(B_3^2+B_4^2)\cos^2\alpha h_1 + \sin^2\alpha h_2 + 2\cos\alpha\sin\alpha(B_3h_3-B_4h_4)+\frac{1}{2}B_5},$$

where $2h_1 = \cos^2(2\varphi-\theta)+\cos^2(\theta), 2h_2=\sin^2(2\varphi-\theta)+\sin^2(\theta),$
$4h_3 = \sin(4\varphi-2\theta)+\sin(2\theta), 2h_4=\sin(2\varphi-2\theta).$ These formulas are valid for any angle $\alpha$, i.e. for any incoming polarization that is not purely s-polarized or purely p-polarized. Actually, they are even valid for s-polarization or p-polarization, but in these extreme cases the $B_1$ and $B_2$ terms are zero and no T-MOKE signal is detected, only a noise signal is.

In the case of $\alpha=45°$, the function f reduces to:

$$4\frac{B_1h_2 + (B_1B_3+B_2B_4)h_3 - (B_1B_4-B_2B_3)h_4 + B_6}{(B_3^2+B_4^2)h_1 + h_2 + 2B_3h_3 - 2B_4h_4 + B_5},$$

where $2h_1 = \cos^2(2\varphi-\theta)+\cos^2(\theta), 2h_2=\sin^2(2\varphi-\theta)+\sin^2(\theta),$
$4h_3 = \sin(4\varphi-2\theta)+\sin(2\theta), 2h_4=\sin(2\varphi-2\theta).$

BRIEF DESCRIPTION OF THE DRAWINGS

Non-limiting examples of the present disclosure will be described in the following, with reference to the appended drawings, in which:

FIG. 1 is a schematic view of an apparatus for measuring T-MOKE signals;

FIG. 2A is a graph of a magnetic field as a sinusoidal time function;

FIGS. 2B and 2C are graphs of measured light intensities as time functions;

FIG. 3A is a graph of measured relative changes in light intensity ($\Delta I/I$) as a function of quarter-wave plate angle $\varphi$ and polarization angle $\theta$ of the second linear polarizer;

FIG. 3B is analogous to FIG. 3A but with theoretical $\Delta I/I$ results;

FIG. 4A is another graph of measured $\Delta I/I$ signals;

FIG. 4B is analogous to FIG. 4A but with fitted $\Delta I/I$ signals;

FIG. 4C is a graph of extracted T-MOKE $\Delta I/I$ signals from the data of FIGS. 4A and 4B; and FIG. 4D is analogous to FIG. 4C but with theoretical results.

DETAILED DESCRIPTION

FIG. 1 represents an apparatus for measuring T-MOKE signals in an ellipsometric procedure. The apparatus comprises a light source 10, a first linear polarizer 20, a magnetic field generator 30, a rotatable quarter-wave plate 40, a rotatable second linear polarizer 50 and a photo-detector 60.

The light source 10 may be an ultra-low noise laser; the wavelength of the light emitted by laser 10 may be 635 nm. The magnetic field generator 30 may be an electromagnet able to reverse the direction of the magnetic field.

A sample 90 may be placed under the influence of the magnetic field generated by magnet 30, for example in a gap thereof. The sample 90 is provided with a reflecting surface 92. The reflecting surface 92 need not be fully reflective; for the present purpose, it is enough if the reflecting surface 92 is able to reflect a small portion of the light falling upon it.

The relative arrangement of the sample 90 and the magnet 30 may be such that the magnetic-field induced magnetization of the sample is perpendicular to the plane of incidence (the latter being defined by the normal to surface 92 and the light beam from the light source 10). Hence, this setup may be arranged to measure T-MOKE signals.

In operation, the light beam from the laser 10 first passes through the first linear polarizer 20 and is subsequently reflected by the reflecting surface 92 of the sample 90, which is magnetized by the magnetic field generated by the magnet 30. The reflected light beam then passes through the rotatable quarter-wave plate 40 and the rotatable second linear polarizer 50, after which the transmitted light intensity is measured with the photo-detector 60. The polarization axis of the light sent to the sample is set by angle $\alpha$ of the first linear polarizer. The measured signals reach a maximum when $\alpha$ is approximately 45°.

What is measured with this configuration is the light intensity I as a function of the applied magnetic field H. The light intensity I changes as the magnetization state of the sample changes. The observed intensity change $\Delta I$ in between inverted magnetization states is caused by T-MOKE. During the measurements, what is monitored is the fractional or relative intensity change $\Delta I/I$ upon magnetization reversal (driven by the reversal of the magnetic field), defined as:

$$\frac{\Delta I}{I} = 2\frac{I(H) - I(-H)}{I(H) + I(-H)} \quad (1)$$

FIG. 2A represents the magnetic field H as a sinusoidal time function during a certain time interval. For this same time interval, FIG. 2B illustrates the measurement of I and $\Delta I$ when the sample has a ferromagnetic coating (e.g. $Co_{0.76}Ru_{0.24}$) and FIG. 2C illustrates the measurement of I and $\Delta I$ when the sample has a non-ferromagnetic coating (e.g. $Co_{0.68}Ru_{0.32}$). The light intensity measured by the photo-detector 60 follows the applied magnetic field and changes as the magnetization state of the sample changes.

The ragged gray lines in FIG. 2B represent the measured light intensity I for a ferromagnetic sample and exhibits an approximate but clear square signal. The ragged gray lines in FIG. 2C represent the measured light intensity for a non-ferromagnetic sample and exhibit an irregular and unclear shape, indicative of a noisy signal. The mean value of the light intensity measured by the photo-detector is the I value of the present methodology. The determination of the $\Delta I$ signal depends on whether the I signal is a clear square signal or an unclear and noisy signal. In both cases, the method includes a FFT (Fast Fourier Transform) analysis of the measured intensity signal. Then, for a ferromagnetic sample with a square signal, $\Delta I$ may be determined from the signal of the first 7 harmonics, represented by the black line in FIG. 2B; and for a non-ferromagnetic sample with a noisy signal, $\Delta I$ may be determined from the amplitude of the first harmonic signal ($\Delta I = 2\times$amplitude), represented by the black quasi-sinusoidal line in FIG. 2C.

An alignment process may be performed before conducting such $\Delta I/I$ measurements. In it, the quarter-wave plate 40 and the second linear polarizer 50 are rotated iteratively to minimize the light intensity at the photo-detector 60. This is useful because, for an arbitrary incoming linear polarization, the phase shift between the s-polarized and p-polarized reflected light components generally leads to an elliptical polarization state in reflection that is independent from magneto-optical effects. To compensate this purely optical ellipticity, the quarter-wave plate may be aligned in a way such that a purely linear polarization state is generated upon transmission through the quarter-wave plate. The final optical element prior to the photo-detector 60, i.e. the second linear polarizer 50, is then aligned in a way such that it is perpendicular to the linear polarization leaving the quarter-wave plate, resulting in the minimum transmission condition for the optical pair of quarter-wave plate 40 and linear polarizer 50. The actual ellipsometric measurement procedure is then executed for orientation pairs of elements 40 and 50 that are close to this minimum transmission condition, because this leads to large $\Delta I/I$ values, as well as to a characteristic interference in between optical and magneto-optical polarization effects (described by equation 8 below).

It is hard to detect actual T-MOKE signals when measuring ultra-small signals where background noise or false field induced signals (that are not magneto-optical in nature) are prevailing upon the smaller T-MOKE signals.

In order to be able to separate or distinguish the actual T-MOKE signal from non-magnetically induced signals, it is taken into account that, upon changing the orientation of the quarter-wave plate 40 (i.e. its angle $\varphi$, which is the angle between the quarter-wave plate axis and the s-polarization orientation) and the second polarizer 50 (i.e. its angle $\theta$, which is the angle between the second polarizer axis and the s-polarization orientation), a real T-MOKE signal (and only a real T-MOKE signal) will follow a precise pattern that can be predicted. A mathematical solution has been derived for the fractional intensity changes $\Delta I/I$ at the photo-detector 60 due to magnetization reversal producing a true T-MOKE signal. This solution describes an exact signal pattern that is produced upon variation of $\varphi$ and $\theta$. The analyses are accomplished by fitting experimental data against the predicted T-MOKE signal pattern as a function of angles $\varphi$ and $\theta$. The data are recorded as $\Delta I/I$ measurements for a grid of preselected ($\varphi$, $\theta$) values.

For every configuration, the detected light intensity I at the photo-detector is $$I = E_D \cdot E_D^*, \quad (2)$$

Where $E_D$ stands for the electric field vector at the photo-detector. $E_D$ can be determined via the Jones calculus as $$E_D = \underline{P2} \cdot \underline{QWP} \cdot \underline{R} \cdot E, \quad (3)$$

where E is the electric field vector of the incoming light beam at the sample 90 (i.e. after the first linear polarizer 20), and $\underline{P2}$ and $\underline{QWP}$ are the respective Jones matrices for the second linear polarizer 50 and the quarter-wave plate 40, and are given as $$\underline{P2} = \begin{bmatrix} \cos^2(\theta) & \sin(\theta)\cos(\theta) \\ \sin(\theta)\cos(\theta) & \sin^2(\theta) \end{bmatrix} \text{ and} \quad (4)$$

$$QWP = \begin{bmatrix} \cos^2(\varphi) + i \cdot \sin^2(\varphi) & (1-i)\sin(\varphi)\cos(\varphi) \\ (1-i)\sin(\varphi)\cos(\varphi) & \sin^2(\varphi) + i \cdot \cos^2(\varphi) \end{bmatrix} \quad (5)$$

Since the focus here is in the transverse MOKE, and given the measurement geometry, the reflection matrix $\underline{R}$ for the sample under investigation can be written as $$\underline{R} = \begin{bmatrix} r_s & 0 \\ 0 & r_p + \beta \end{bmatrix} = r_p \begin{bmatrix} \tilde{r}_s & 0 \\ 0 & 1 + \tilde{\beta} \end{bmatrix} = r_p \underline{\tilde{R}}, \quad (6)$$

with $\beta$ switching its sign upon magnetization reversal.

Finally, the electric field vector at the photo-detector $E_D$ can be derived via the matrix product $$E_D = \begin{bmatrix} \cos^2(\theta) & \sin(\theta)\cos(\theta) \\ \sin(\theta)\cos(\theta) & \sin^2(\theta) \end{bmatrix} \quad (7)$$
$$\begin{bmatrix} \cos^2(\varphi) + i \cdot \sin^2(\varphi) & (1-i)\sin(\varphi)\cos(\varphi) \\ (1-i)\sin(\varphi)\cos(\varphi) & \sin^2(\varphi) + i \cdot \cos^2(\varphi) \end{bmatrix} \begin{bmatrix} r_s & 0 \\ 0 & r_p + \beta \end{bmatrix} \begin{bmatrix} E_S \\ E_P \end{bmatrix}$$

Given the above and assuming that $\alpha$ was set to 45° (whereby $E_S = E_P$ in the incoming light), the mathematical solution for fractional intensity changes at the photo-detector $\Delta I/I$ due to magnetization reversal (due to applied field reversal) was derived as $$\frac{\Delta I}{I} = 4 \frac{B_1 \cdot h_2 + (B_1 B_3 + B_2 B_4) \cdot h_3 - (B_1 B_4 - B_2 B_3) \cdot h_4 + B_6}{(B_3^2 + B_4^2) \cdot h_1 + h_2 + 2 \cdot B_3 \cdot h_3 - 2 \cdot B_4 \cdot h_4 + B_5}, \quad (8)$$

With $$h_1 = \frac{\cos^2(2\varphi - \theta)}{2} + \frac{\cos^2(\theta)}{2} \quad (9)$$

$$h_2 = \frac{\sin^2(2\varphi - \theta)}{2} + \frac{\sin^2(\theta)}{2}$$

$$h_3 = \frac{\sin(4\varphi - 2\theta)}{4} + \frac{\sin(2\theta)}{4}$$

$$h_4 = \frac{\sin(2\varphi - 2\theta)}{2}$$

And $$B_1 = \text{Re}(\tilde{\beta}) \quad (10)$$
$$B_2 = \text{Im}(\tilde{\beta})$$
$$B_3 = \text{Re}(\tilde{r}_s)$$
$$B_4 = \text{Im}(\tilde{r}_s)$$

$B_1$ and $B_2$ represent the magneto-optical effect of the sample and $B_3$ and $B_4$ represent the Fresnel reflection coefficients, but Eq. (8) also includes two corrective terms: $B_5$ describes the fact that, even under minimum transmission conditions, the transmitted light intensity is not zero but has a non-vanishing value, namely $B_5$, due to imperfections of the optical elements. $B_6$ describes the fact that there might be a non-T-MOKE $\Delta I/I$ signal that can be separated because it does not have the same $(\varphi, \theta)$ dependence as a true T-MOKE signal. It is herein assumed a constant false or background $\Delta I/I$ signal, the amplitude of which is $B_6$.

This derived solution was developed for angle $\alpha$ being set to 45 degrees. Nevertheless, the method works for any arbitrary incoming polarization that is not purely s-polarized or purely p-polarized. The general solution for any angle $\alpha$ is:

$$4 \frac{B_1 \sin^2\alpha h_2 + \cos\alpha\sin\alpha \left[ \begin{array}{c} (B_1 B_3 + B_2 B_4) h_3 - \\ (B_1 B_4 - B_2 B_3) h_4 \end{array} \right] + \frac{1}{2} B_6}{(B_3^2 + B_4^2)\cos^2\alpha h_1 + \sin^2\alpha h_2 + 2\cos\alpha\sin\alpha(B_3 h_3 - B_4 h_4) + \frac{1}{2} B_5}$$

FIG. 3 represents an example of the described methodology for a $Co_{0.76}Ru_{0.24}$ sample, which is a ferromagnetic material and for which a $\Delta I/I$ signal has been measured as a function of angles $\varphi$ and $\theta$, the results being presented as gray color codes in FIG. 3A. The sample exhibits a robust magneto-optical signal with clear zero crossing point and inversion of the signal sign. The theoretical T-MOKE predictions according to Eq. (8) are presented in FIG. 3B. It can be seen that the measured data (FIG. 3A) are in excellent agreement with the fit obtained via Eq. (8) (FIG. 3B). This indicates that the methodology makes an exact prediction of the true magneto-optical behavior.

The $\Delta I/I$ signal and corresponding fit for a non-ferromagnetic $Co_{0.68}Ru_{0.32}$ sample are presented in FIGS. 4A and 4B; they don't show an obvious magneto-optical response that displays the correct symmetry. Instead, the $\Delta I/I$ signal is dominated by a false background signal and the very weak magneto optical signal appears to be suppressed by this false signal. In order to obtain the suppressed pure magneto optical signal, the experimental data is analyzed with Equation 8. This data analysis allows to evaluate the false signal and separate it from the real magneto optical signal. The pure magneto optical signal of this non-ferromagnetic sample after the subtraction of the false signal is presented in FIG. 4C, and the corresponding pure T-MOKE signal fit is presented in FIG. 4D. These results substantiate the ability of the present methodology to measure magneto optical properties even for non-ferromagnetic samples with extremely low magneto optical signals.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow. If reference signs related to drawings are placed in parentheses in a claim, they are solely for attempting to increase the intelligibility of the claim, and shall not be construed as limiting the scope of the claim.

For example, useful results can be obtained by considering just a subset (any subset) of $\{B_1, B_2, B_3, B_4, B_5, B_6\}$, e.g. only $B_1$, so that it is not strictly necessary to always compute all of $B_1$, $B_2$, $B_3$, $B_4$, $B_5$ and $B_6$.

What is claimed is:

1. A method for extracting a transverse magneto-optic Kerr effect (T-MOKE) signal in an ellipsometric measurement procedure upon a sample, the method employing an apparatus comprising a light source intended to emit a light beam that is to follow an optical path, the sample having a reflecting surface arranged to reflect, at least partially, the light beam in an optical plane of incidence, the apparatus further comprising:
   a first linear polarizer having an axis and being located on the optical path between the light source and the reflecting surface;

a device to produce a magnetic field at a sample location, the device being configured to direct the magnetic field perpendicularly to the optical plane of incidence and to reverse the direction of the magnetic field;

a rotatable quarter-wave plate having an axis and being located after the reflecting surface on the optical path of the reflected light beam;

a second linear polarizer that is rotatable and is located after the quarter-wave plate on the optical path of the reflected light beam, the quarter-wave plate having an axis;

a photo-detector located after the second linear polarizer on the optical path of the reflected light beam, the photo-detector being configured to measure an intensity of the light beam that reaches it; and the sample is represented by a Jones reflection matrix of the form $$\begin{bmatrix} r_s & 0 \\ 0 & r_p + \beta \end{bmatrix},$$

where $r_s$ is a complex Fresnel reflection coefficient for s-polarization, $r_p$ is the complex Fresnel reflection coefficient for p-polarization and $\beta$ is a complex coefficient that represents the component of light reflected on the reflecting surface due to the magnetic-field induced magnetization of the sample in a direction perpendicular to the optical plane of incidence, whereby $\tilde{\beta}=\beta/r_p$ is a relative T-MOKE coefficient;

the method comprising the steps of:

a) defining a grid of at least six angle pairs, each angle pair being formed by an orientation angle φ for the quarter-wave plate and a polarization angle θ for the second linear polarizer, the orientation angle φ being an angular distance between the quarter-wave plate axis and the optical plane of incidence, and the polarization angle θ being an angular distance between the second linear polarizer axis and the optical plane of incidence;

b) setting the first linear polarizer at a fixed polarization angle α that is neither 0° nor 90°, the fixed polarization angle α being the angular distance between the first linear polarizer axis and the optical plane of incidence;

c) setting the quarter-wave plate at the orientation angle φ of an angle pair;

d) setting the second linear polarizer at the polarization angle θ of the same angle pair of step (c);

e) testing the set angle pair by making the light source to emit the light beam along the optical path, whereby the light beam is transmitted through the first linear polarizer, is reflected, at least partially, by the reflecting surface of the sample, is transmitted through the quarter-wave plate, is transmitted through the second linear polarizer and reaches the photo-detector;

f) recording a measurement of the light intensity from the photo-detector;

g) recording a measurement of the light intensity from the photo-detector upon a magnetic-field reversal with respect to the measurement of step (f);

h) computing and recording a relative change in the light intensity (ΔI/I) due to magnetization reversal upon the magnetic-field reversal of step (g);

i) setting the quarter-wave plate at the orientation angle of another angle pair;

j) setting the second linear polarizer at the polarization angle of the same angle pair of step (i), k) repeating steps (e) to (j) until at least six of the angle pairs of the grid have been tested; and l) determining numerical values of real free fit parameters $B_1$, $B_2$, $B_3$, $B_4$, $B_5$ and $B_6$ by matching the collection of the recorded relative changes in the light intensity to equation $\Delta I/I = f(\alpha, \varphi, \theta, B_1, B_2, B_3, B_4, B_5, B_6)$, where f is a function mathematically derived for the relative change in the light intensity.

2. The method according to claim 1, comprising the step of computing the relative T-MOKE coefficient $\tilde{\beta}$ as a derived function of $B_1$ and $B_2$.

3. The method according to claim 2, wherein the relative T-MOKE coefficient $\tilde{\beta}$ is computed as $\tilde{\beta}=B_1+iB_2$.

4. The method according to claim 1, wherein the recorded relative change in the light intensity is computed as $$\Delta I/I = \frac{2(I/(H) - I/(-H))}{I/(H) + I/(-H)},$$

where I(H) is the intensity of the light beam that reaches the photo-detector when the magnetic field at the sample location is H, and I(−H) is the intensity of the light beam that reaches the photo-detector when the magnetic field at the sample location is −H.

5. The method according to claim 1, wherein the recorded measurement of the light intensity I is computed as a mean value of the measurement of the light intensity at the photo-detector, and the change in the light intensity ΔI is computed as twice the amplitude of the first harmonic of the light beam.

6. The method according to claim 5, wherein the first harmonic is obtained by Fast Fourier Transform analysis of the recorded measurement of the light intensities, using sinusoidal magnetic field modulation.

7. The method according to claim 1, wherein the mathematical function for the relative change in the light intensity is derived as $$\Delta I/I = 4\frac{B_1\sin^2\alpha h_2 + \cos\alpha\sin\alpha\left[\begin{array}{c}(B_1B_3+B_2B_4)h_3 -\\(B_1B_4-B_2B_3)h_4\end{array}\right] + \frac{1}{2}B_6}{(B_3^2+B_4^2)\cos^2\alpha h_1 + \sin^2\alpha h_2 + 2\cos\alpha\sin\alpha(B_3h_3-B_4h_4) + \frac{1}{2}B_5},$$

where $2h_1=\cos^2(2\varphi-\theta)+\cos^2(\theta), 2h_2=\sin^2(2\varphi-\theta)+\sin^2(\theta),$
$4h_3=\sin(4\varphi-2\theta)+\sin(2\theta), 2h_4=\sin(2\varphi-2\theta).$ 8. The method according to claim 7, wherein $B_3$ is the real part of $r_s/r_p$.

9. The method according to claim 7, wherein $B_4$ is the imaginary part of $r_s/r_p$.

10. The method according to claim 8, wherein $B_4$ is the imaginary part of $r_s/r_p$.

11. The method according to claim 7, wherein $B_5$ represents optical or electronic imperfections in the apparatus.

12. The method according to claim 8, wherein $B_5$ represents optical or electronic imperfections in the apparatus.

13. The method according to claim 9, wherein $B_5$ represents optical or electronic imperfections in the apparatus.

14. The method according to claim 7, wherein $B_6$ represents background noise.

15. The method according to claim 8, wherein $B_6$ represents background noise.

16. The method according to claim 9, wherein $B_6$ represents background noise.

17. The method according to claim 10, wherein $B_6$ represents background noise.

18. The method according to claim 1, wherein the fixed polarization angle $\alpha$ is set at 45°.

19. The method according to claim 18, wherein the mathematical function for the relative change in the light intensity is derived as $$\Delta I/I = 4\frac{B_1\sin^2\alpha h_2 + \cos\alpha\sin\alpha\left[\begin{array}{c}(B_1B_3 + B_2B_4)h_3 - \\ (B_1B_4 - B_2B_3)h_4\end{array}\right] + \frac{1}{2}B_6}{(B_3^2 + B_4^2)\cos^2\alpha h_1 + \sin^2\alpha h_2 + 2\cos\alpha\sin\alpha(B_3h_3 - B_4h_4) + \frac{1}{2}B_5},$$

where $2h_1=\cos^2(2\varphi-\theta)+\cos^2(\theta), 2h_2=\sin^2(2\varphi-\theta)+\sin^2(\theta),$
$4h_3=\sin(4\varphi-2\theta)+\sin(2\theta), 2h_4=\sin(2\varphi-2\theta).$ 20. The method according to claim 1, wherein the matching of the collection of the recorded relative changes in the light intensity to equation ($\alpha$, $\varphi$, $\theta$; $B_j$), where j=1, 2, 3, 4, 5, 6, is effected by means of a least-squares fit in which all $B_j$ are free fit parameters.

* * * * *